United States Patent
Shen et al.

(10) Patent No.: US 7,803,666 B2
(45) Date of Patent: Sep. 28, 2010

(54) MANUFACTURING PROCESS FOR A QUAD FLAT NON-LEADED CHIP PACKAGE STRUCTURE

(75) Inventors: Geng-Shin Shen, Tainan County (TW); Chun-Ying Lin, Tainan County (TW)

(73) Assignees: ChipMOS Technologies INc., Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 191 days.

(21) Appl. No.: 12/270,666

(22) Filed: Nov. 13, 2008

(65) Prior Publication Data
US 2009/0064494 A1 Mar. 12, 2009

Related U.S. Application Data

(63) Continuation-in-part of application No. 11/326,749, filed on Jan. 5, 2006, now Pat. No. 7,560,306.

(30) Foreign Application Priority Data
Jul. 21, 2005 (TW) .............................. 94124656 A

(51) Int. Cl.
*H01L 21/44* (2006.01)
(52) U.S. Cl. ............... 438/126; 257/686; 257/E21.499; 438/108; 438/109; 438/617
(58) Field of Classification Search ................. 257/686, 257/E21.499; 438/108, 109, 126, 617
See application file for complete search history.

(56) References Cited

U.S. PATENT DOCUMENTS

| 6,001,671 A | 12/1999 | Fjelstad |
| 6,448,506 B1 | 9/2002 | Glenn et al. |
| 7,091,581 B1 | 8/2006 | McLellan et al. |
| 2002/0039808 A1 | 4/2002 | Fukutomi et al. |
| 2006/0223234 A1 | 10/2006 | Terayama et al. ............ 438/113 |

FOREIGN PATENT DOCUMENTS

CN 1501488 6/2004

OTHER PUBLICATIONS

U.S. Office Action of U.S. Appl. No. 11/326,2006, dated Dec. 5, 2008.

*Primary Examiner*—Asok K Sarkar
(74) *Attorney, Agent, or Firm*—J.C. Patents

(57) ABSTRACT

A manufacturing process for a Quad Flat Non-leaded (QFN) chip package structure is provided. First, a patterned conductive layer and a patterned solder resist layer on the patterned conductive layer are provided. A plurality of chips are bonded onto the patterned solder resist layer such that the patterned solder resist layer are between the chips and the patterned conductive layer. The chips are electrically connected to the patterned conductive layer by a plurality of bonding wires, wherein the chips and the bonding wires are at the same side of the patterned conductive layer. At least one molding compound is formed to encapsulate the patterned conductive layer, the patterned solder resist layer, the chips and the bonding wires. Then, the molding compound, the patterned conductive layer and the patterned solder resist layer are separated.

23 Claims, 5 Drawing Sheets

MANUFACTURING PROCESS FOR A QUAD FLAT NON-LEADED CHIP PACKAGE STRUCTURE

CROSS-REFERENCE TO RELATED APPLICATION

This application is a continuation-in-part of U.S. application Ser. No. 11/326,749, filed on Jan. 5, 2006, all disclosure is incorporated therewith. The prior application Ser. No. 11/326,749 claims the priority benefit of Taiwan application serial no. 94124656, filed on Jul. 21, 2005. The entirety of each of the above-mentioned patent applications is hereby incorporated by reference herein and made a part of this specification.

BACKGROUND OF THE INVENTION

1. Field of the Invention

The present invention relates to a manufacturing process for a chip package structure. More particularly, the present invention relates to a manufacturing process for a Quad Flat Non-leaded (QFN) chip package structure.

2. Description of Related Art

The semiconductor industries have bee highly developed. With the trends of electrification, electronic and semiconductor devices are widely used in the daily life, including entertainment, education, transportation and households. The design of the electrical products becomes more complex, smaller-sized, light-weight and humanized, in order to offer more convenience for the consumers. In the package structures, the leadframe is one of the most commonly used elements, applied in various package products. Based on the type of leadframes, the Quad Flat Packages (QFP) can be categorized as quad flat chip package with "I" lead (QFI), quad flat chip package with "J" lead (QFJ) and Quad Flat Non-leaded (QFN) chip package. Because leads of the leadframe in the QFN chip package end at the edges of the chip package structure, the QFN chip package has a small size. Since the QFN chip package provides shorter electrical path and faster signal transmission, the QFN chip package has been widely used as low pin count solutions for power elements.

In general, in the fabricating process of a QFN chip package, a plurality of chips are disposed on the leadframe, wherein the leadframe includes a plurality of lead sets connected to each other and each chip is surrounded by one lead set. Each chip is electrically connected to one lead set through wire bonding. Then, at least one molding compound is formed to encapsulate the leadframe, the chips and the bonding wires. Finally, a plurality of QFN chip packages are formed through a singulation process, wherein the sigulation process includes a punch process or a sawing process.

SUMMARY OF THE INVENTION

The present invention is to provide a manufacturing process for a QFN chip package structure having small thickness.

As embodied and broadly described herein, the present invention provides a manufacturing process for a Quad Flat Non-leaded (QFN) chip package structure. First, a patterned conductive layer and a patterned solder resist layer on the patterned conductive layer are provided. A plurality of chips are bonded onto the patterned solder resist layer such that the patterned solder resist layer are between the chips and the patterned conductive layer. The chips are electrically connected to the patterned conductive layer by a plurality of bonding wires, wherein the chips and the bonding wires are at the same side of the patterned conductive layer. At least one molding compound is formed to encapsulate the patterned conductive layer, the patterned solder resist layer, the chips and the bonding wires. Then, the molding compound, the patterned conductive layer and the patterned solder resist layer are separated.

According to an embodiment of the present invention, a plurality of first openings are formed on the patterned solder resist layer, wherein a part of the patterned conductive layer is exposed by the first openings.

According to an embodiment of the present invention, the adhesive layer is a B-staged adhesive layer.

According to an embodiment of the present invention, the B-staged adhesive layer is formed on a rear surface of the chip in advance.

According to an embodiment of the present invention, the B-staged adhesive layer is formed on the patterned conductive layer before the chip is attached on the patterned conductive layer.

According to an embodiment of the present invention, the patterned solder resist layer is a B-staged layer.

According to an embodiment of the present invention, the B-staged layer is photosensitive.

As embodied and broadly described herein, the present invention provides another manufacturing process for a Quad Flat Non-leaded (QFN) chip package structure. First, a patterned conductive layer and a patterned solder resist layer on the patterned conductive layer are provided. A plurality of chips are bonded onto the patterned conductive layer such that the patterned solder resist layer and the chips are at the same side of the patterned conductive layer. The chips are electrically connected to the patterned conductive layer by a plurality of bonding wires, wherein the chips and the bonding wires are at the same side of the patterned conductive layer. At least one molding compound is formed to encapsulate the patterned conductive layer, the patterned solder resist layer, the chips and the bonding wires. Then, the molding compound, the patterned conductive layer and the patterned solder resist layer are separated.

According to an embodiment of the present invention, a method for providing the patterned conductive layer and the patterned solder resist layer includes providing a conductive layer, forming a solder resist layer on the conductive layer, patterning the solder resist layer to form the patterned solder resist layer, wherein a part of the conductive layer is exposed by the patterned solder resist layer, and patterning the conductive layer to form the patterned conductive layer.

According to an embodiment of the present invention, a method for providing the patterned conductive layer and the patterned solder resist layer includes providing a solder resist layer, forming a conductive layer on the solder resist layer, patterning the solder resist layer to form the patterned solder resist layer, wherein a part of the conductive layer is exposed by the patterned solder resist layer, and patterning the conductive layer to form the patterned conductive layer.

According to an embodiment of the present invention, a method for providing the patterned conductive layer and the patterned solder resist layer includes providing a conductive layer, forming a solder resist layer on the conductive layer, patterning the conductive layer to form the patterned conductive layer, and patterning the solder resist layer to form the patterned solder resist layer, wherein a part of the patterned conductive layer is exposed by the patterned solder resist layer.

According to an embodiment of the present invention, a method for providing the patterned conductive layer and the patterned solder resist layer includes providing a solder resist layer, forming a conductive layer on the solder resist layer, patterning the conductive layer to form the patterned conductive layer, and patterning the solder resist layer to form the patterned solder resist layer, wherein a part of the patterned conductive layer is exposed by the patterned solder resist layer.

According to an embodiment of the present invention, a plurality of die pads and a plurality of leads are formed on the patterned conductive layer.

According to an embodiment of the present invention, a plurality of first openings and a plurality of second openings are formed on the patterned solder resist layer, wherein a part of the patterned conductive layer is exposed by the first openings and the second openings.

According to an embodiment of the present invention, the manufacturing process for a QFN chip package structure further includes forming an adhesive layer between the chips and the patterned conductive layer.

In summary, the manufacturing process for the QFN chip package structure of the present invention can produce the QFN chip package having a solder resist layer to enhance the structure strength of the QFN chip package, such that the thickness of the patterned conductive layer can be decreased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
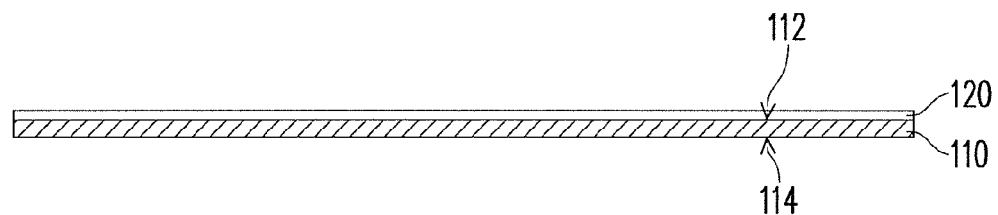
FIG. 1A to FIG. 1I are cross-sectional views schematically illustrating the manufacturing process for the QFN chip package structure according to an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1A to FIG. 1I are cross-sectional views schematically illustrating the manufacturing process for the QFN chip package structure according to an embodiment of the present invention. Referring to FIG. 1A, a solder resist layer 120 and a conductive layer 110 having a first surface 112 and a second surface 114 are provided, and the solder resist layer 120 is formed on the first surface 112 by molding, printing or coating. In a preferred embodiment, a brown oxidation or a black oxidation process can further be performed on the conductive layer 110 to improve the surface roughness of the conductive layer 110. Accordingly, the combination between the conductive layer 110 and the solder resist layer 120 is improved.

Figure 1B:
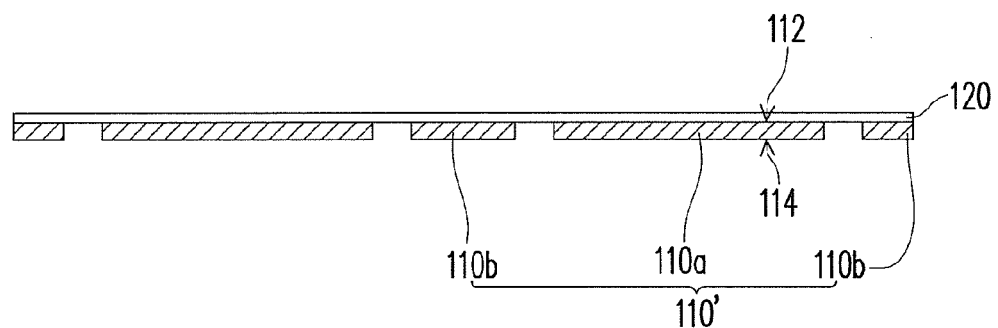

Referring to FIG. 1B, the conductive layer 110 is then patterned through a photolithography and etching process to form a patterned conductive layer 110', wherein the patterned conductive layer 110' has a plurality of die pads 110a and a plurality of leads 310b.

Figure 1C:
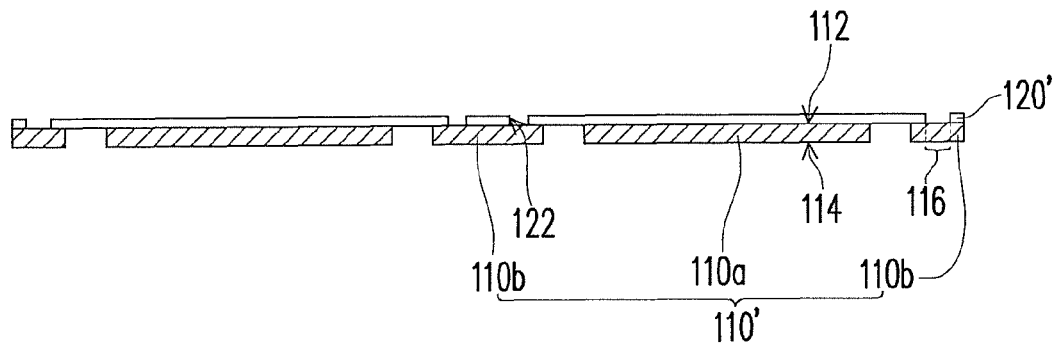

Referring to FIG. 1C, the solder resist layer 120 is then patterned to form a patterned solder resist layer 120' having a plurality of first openings 122, wherein a part of the first surface 112 is exposed by the first openings 122. In other words, a plurality of first bonding pads 116 are defined by the patterned solder resist layer 120' formed on a part of the first surface 112. It is noted that sequence of the patterning processes for forming the patterned conductive layer 110' and the patterned solder resist layer 120' is not limited in the present invention.

In the present embodiment, the patterned solder resist layer 120' may be a B-staged film, which is also a solder resist film, and the first openings 122 are formed before or after the patterned solder resist layer 120' being attached onto the conductive layer 110. In an alternative embodiment, the patterned solder resist layer 120' may be formed by coated a liquid solder resist on the first surface 112 of the conductive layer 110 first, and the liquid solder resist should be cured and patterned to form the patterned solder resist layer 120' after being coated on the first surface 112 of the conductive layer 110, and the liquid solder resist could be a B-staged liquid solder resist. In this embodiment, the patterned solder resist layer 120', for example, is a B-staged film. Furthermore, the patterned solder resist layer 120' could be a B-staged film which is photosensitive.

Additionally, in a preferred embodiment, a plating process may be performed so as to form a plating conductive layer (not shown) on the first bonding pads 116. The plating conductive layer may be a Ni/Au stacked layer, or other suitable metal layers. It is noted that the plating conductive layer may be formed before or after the patterned solder resist layer 120' is formed on the conductive layer 110.

Figure 1D:
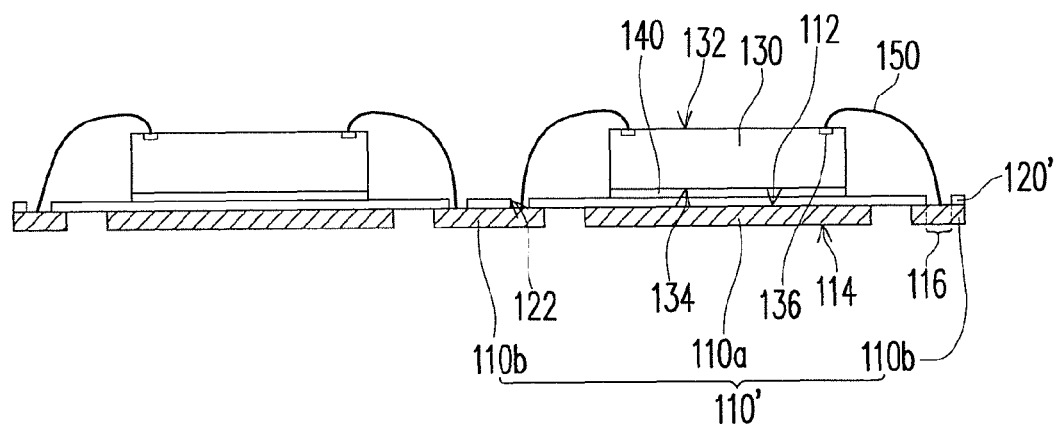

Referring to FIG. 1D, a plurality of chips 130 are adhered to the patterned solder resist layer 120' and a plurality of bonding wires 150 are then formed to connect the chips 130 and the patterned conductive layer 110', wherein each chip 130 has an active surface 132, a rear surface 134 opposite to the active surface 132 and a plurality of second bonding pads 136 disposed on the active surface 132. Each chip 130 is adhered on the patterned solder resist layer 120' by an adhesive layer 140 between the chip 130 and the patterned conductive layer 110' such that the patterned solder resist layer 120' is between the patterned conductive layer 110' and each chip 130. In an alternative embodiment, the chips 130 could be adhered on the patterned solder resist layer 120' without the adhesive layer 140, wherein the patterned solder resist layer 120' is a B-staged layer formed on the leads 110b and the die pads 110a without being fully cured before the chips 130 are attached.

In the present embodiment, the bonding wires 150 are formed by a wire bonding process, such that each bonding wire 150 is electrically connected between a first bonding pad 116 and a second bonding pad 136. The bonding wires 150 are, for example, Au wires.

In the present embodiment, the adhesive layer 140 is a B-staged adhesive layer, for example. The B-staged adhesive layer can be obtained from 8008 or 8008HT of ABLESTIK. Additionally, the B-staged adhesive layer can also be obtained from 6200, 6201 or 6202C of ABLESTIK, or obtained from SA-200-6, SA-200-10 provided by HITACHI Chemical CO., Ltd. In an embodiment of the present invention, the B-staged adhesive layer 140 is formed on the rear surface of a wafer. When the wafer is separated, a plurality of chip 130 having the adhesive layer 140 on the rear surface 134 thereof is obtained. Therefore, the B-staged adhesive layer 140 is favorable to mass production. Additionally, the B-staged adhesive layer 140 may be formed by spin-coating, printing, or other suitable processes. More specifically, the adhesive layer 140 is formed on the rear surface 134 of the chip 130 in advance. Specifically, a wafer having a plurality of chip 130 arranged in an array is first provided. Then, a two-stage adhesive layer is formed over the rear surface 134 of the chip 130 and is partially cured by heating or UV irradiation to form the B-staged adhesive layer 140. Sometimes, the B-staged adhesive layer 140 could be formed on the patterned solder resist layer 120' before the chip 130 being attached on the patterned solder resist layer 120'.

In the present embodiment, the B-staged adhesive layer 140 is fully cured after the chip 130 being attached to the patterned solder resist layer 120' or later by a post cured or being encapsulated by the molding compound 160.

Figure 1E:
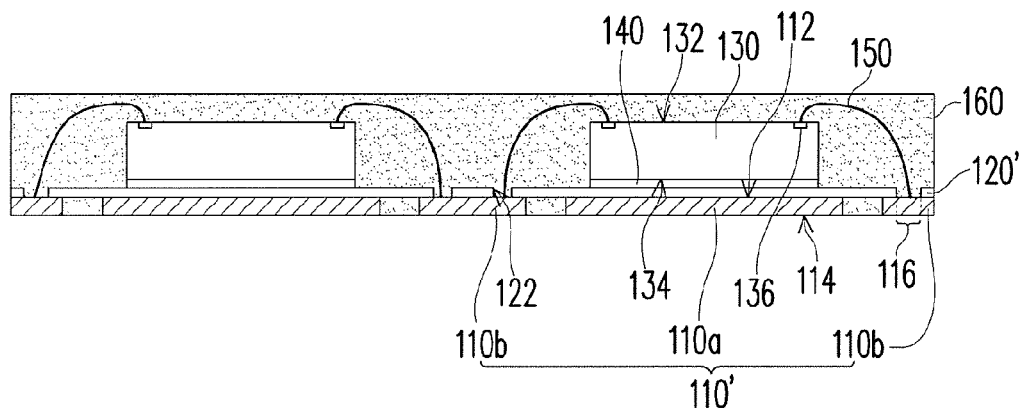

Referring to FIG. 1E, at least one molding compound 160 encapsulating the patterned conductive layer 110', the patterned solder resist layer 120', the chip 130 and the bonding wires 150 is formed. The material of the molding compound 160 is, for example, epoxy resin.

Figure 1F:
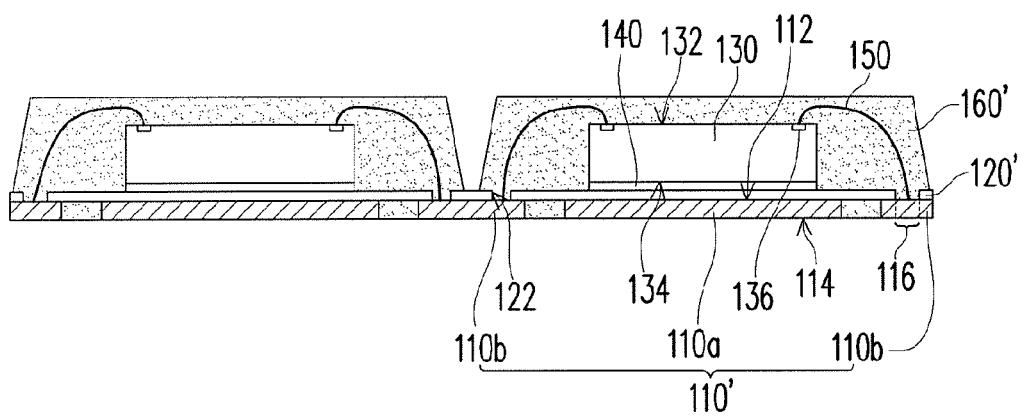

Referring to FIG. 1F, instead of forming a molding compound 160 encapsulating the patterned conductive layer 110', the patterned solder resist layer 120', the chip 130 and the bonding wires 150, a plurality of molding compound 160' could be formed to encapsulate the patterned conductive layer 110', the patterned solder resist layer 120', the chip 130 and the bonding wires 150.

Figure 1G:
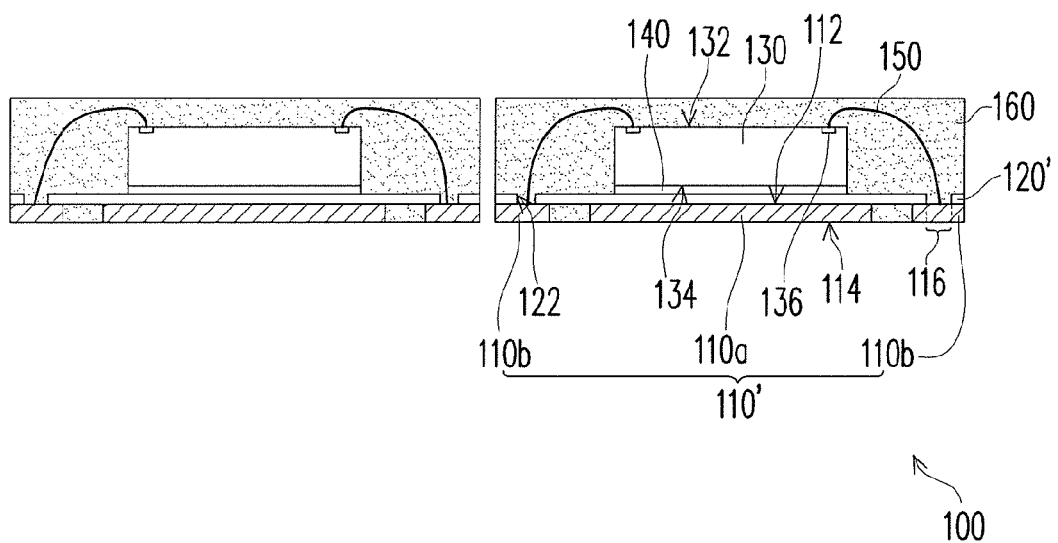
Figure 1H:
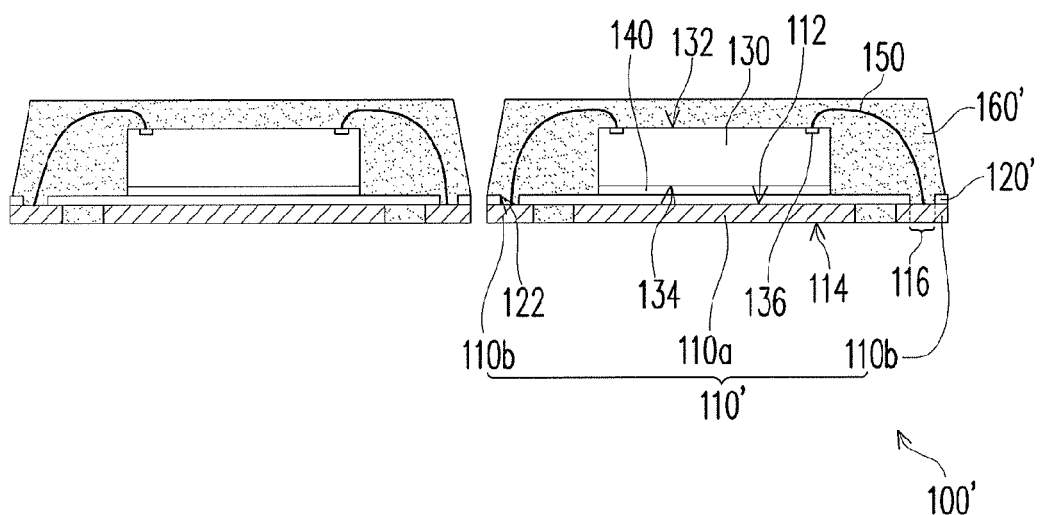

Referring to FIG. 1G and FIG. 1H, a singulation process is performed for forming a plurality of QFN chip packages 100 (shown in FIG. 1G) or a plurality of QFN chip packages 100' (shown in FIG. 1H), wherein the singulation process comprises a punch process or a sawing process.

As shown in FIG. 1G, the QFN chip package 100 of the present invention mainly includes a patterned conductive layer 110', a patterned solder resist layer 120', a chip 130, a plurality of bonding wires 150 and a molding compound 160. The patterned conductive layer 110' has a first surface 112 and a second surface 114 opposite to each other, wherein the patterned conductive layer 110' has a die pad 110a and a plurality of leads 110b surrounding the die pad 110a. The patterned solder resist layer 120' is disposed on the first surface 112, wherein a part of the first surface 112 is exposed by the patterned solder resist layer 120'. The chip 130 is disposed on the patterned solder resist layer 120', wherein the patterned solder resist layer 120' is between the patterned conductive layer 110 and the chip 130. The bonding wires 150 are electrically connected to the chip 130 and the patterned conductive layer 110' exposed by the patterned solder resist layer 120'. The molding compound 160 encapsulates the pattern conductive layer 110', the patterned solder resist layer 120', the chip 130 and the bonding wires 150, wherein the area between the die pad 110a and the leads 110b is filled with the molding compound 160.

Figure 1I:
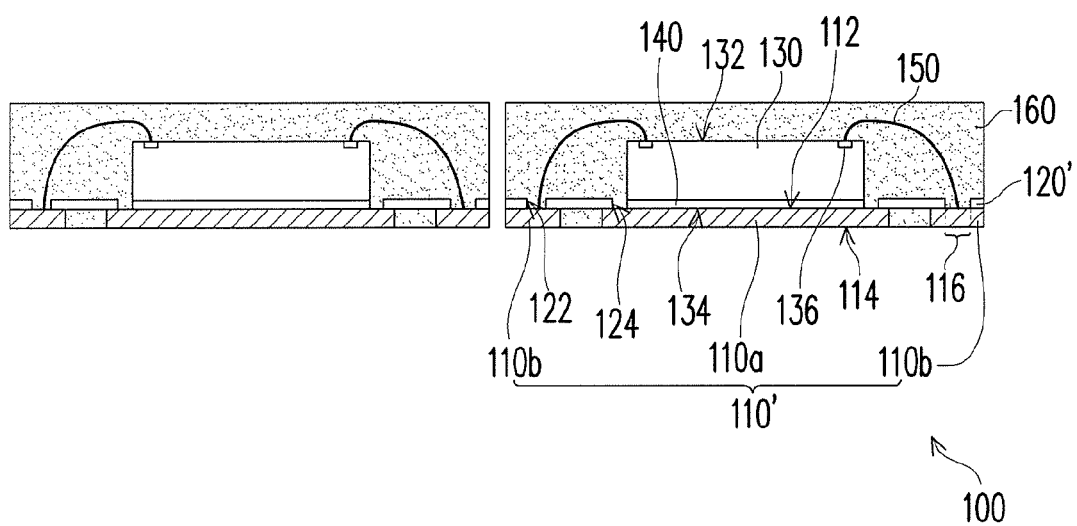

Referring to FIG. 1I, in an alternative embodiment, a plurality of second openings 124 may be formed on the patterned solder resist layer 120', such that each chip 130 is disposed in one of the second openings 124 and is adhered on the first surface 112 exposed by the patterned solder resist layer 120' by the adhesive layer 140. In the present embodiment, the adhesive layer 140 is a B-staged adhesive layer, a conductive layer or a non conductive layer, for example.

Compared with the conventional manufacturing process for a QFN chip package structure, the manufacturing process of the present invention can produce the QFN chip package having a solder resist layer to enhance the structure strength of the QFN chip package, such that the thickness of the patterned conductive layer can be decreased. Additionally, the overall thickness of the QFN chip package is decreased and the production cost is lowered, such that the throughput is improved in the present invention.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing process for a Quad Flat Non-leaded (QFN) chip package structure, comprising:

providing a patterned conductive layer and a patterned solder resist layer on the patterned conductive layer;

bonding a plurality of chips onto the patterned solder resist layer such that the patterned solder resist layer is between the chips and the patterned conductive layer;

electrically connecting the chips to the patterned conductive layer by a plurality of bonding wires, wherein the chips and the bonding wires are at the same side of the patterned conductive layer;

forming at least one molding compound to encapsulate the patterned conductive layer, the patterned solder resist layer, the chips and the bonding wires; and separating the molding compound, the patterned conductive layer and the patterned solder resist layer.

2. The manufacturing process for a QFN chip package structure as claimed in claim 1, wherein a method for providing the patterned conductive layer and the patterned solder resist layer comprises:

providing a conductive layer;

forming a solder resist layer on the conductive layer;

patterning the solder resist layer to form the patterned solder resist layer, wherein a part of the conductive layer is exposed by the patterned solder resist layer; and patterning the conductive layer to form the patterned conductive layer.

3. The manufacturing process for a QFN chip package structure as claimed in claim 1, wherein a method for providing the patterned conductive layer and the patterned solder resist layer comprises:

providing a solder resist layer;

forming a conductive layer on the solder resist layer;

patterning the solder resist layer to form the patterned solder resist layer, wherein a part of the conductive layer is exposed by the patterned solder resist layer; and patterning the conductive layer to form the patterned conductive layer.

4. The manufacturing process for a QFN chip package structure as claimed in claim 1, wherein a method for providing the patterned conductive layer and the patterned solder resist layer comprises:

providing a conductive layer;

forming a solder resist layer on the conductive layer;

patterning the conductive layer to form the patterned conductive layer; and patterning the solder resist layer to form the patterned solder resist layer, wherein a part of the patterned conductive layer is exposed by the patterned solder resist layer.

5. The manufacturing process for a QFN chip package structure as claimed in claim 1, wherein a method for providing the patterned conductive layer and the patterned solder resist layer comprises:

providing a solder resist layer;

forming a conductive layer on the solder resist layer;

patterning the conductive layer to form the patterned conductive layer; and patterning the solder resist layer to form the patterned solder resist layer, wherein a part of the patterned conductive layer is exposed by the patterned solder resist layer.

6. The manufacturing process for a QFN chip package structure as claimed in claim 1, wherein a plurality of die pads and a plurality of leads are formed on the patterned conductive layer.

7. The manufacturing process for a QFN chip package structure as claimed in claim 1, wherein a plurality of first openings are formed on the patterned solder resist layer, wherein a part of the patterned conductive layer is exposed by the first openings.

8. The manufacturing process for a QFN chip package structure as claimed in claim 1, further comprising forming an adhesive layer between the chips and the patterned solder resist layer.

9. The manufacturing process for a QFN chip package structure as claimed in claim 8, wherein the adhesive layer is a B-staged adhesive layer.

10. The manufacturing process for a QFN chip package structure as claimed in claim 9, wherein the B-staged adhesive layer is formed on a rear surface of the chip in advance.

11. The manufacturing process for a QFN chip package structure as claimed in claim 9, wherein the B-staged adhesive layer is formed on the patterned conductive layer before the chip is attached on the patterned conductive layer.

12. The manufacturing process for a QFN chip package structure as claimed in claim 1, wherein the patterned solder resist layer is a B-staged layer.

13. The manufacturing process for a QFN chip package structure as claimed in claim 12, wherein the B-staged layer is photosensitive.

14. The manufacturing process for a QFN chip package structure as claimed in claim 1, wherein a brown oxidation or a black oxidation process can further be performed on the patterned conductive layer.

15. A manufacturing process for a Quad Flat Non-leaded (QFN) chip package structure, comprising:
    providing a patterned conductive layer and a patterned solder resist layer on the patterned conductive layer;
    bonding a plurality of chips onto the patterned conductive layer such that the patterned solder resist layer and the chips are at the same side of the patterned conductive layer;
    electrically connecting the chips to the patterned conductive layer by a plurality of bonding wires, wherein the chips and the bonding wires are at the same side of the patterned conductive layer;
    forming at least one molding compound to encapsulate the patterned conductive layer, the patterned solder resist layer, the chips and the bonding wires; and
    separating the molding compound, the patterned conductive layer and the patterned solder resist layer.

16. The manufacturing process for a QFN chip package structure as claimed in claim 15, wherein a method for providing the patterned conductive layer and the patterned solder resist layer comprises:
    providing a conductive layer;
    forming a solder resist layer on the conductive layer;
    patterning the solder resist layer to form the patterned solder resist layer, wherein a part of the conductive layer is exposed by the patterned solder resist layer; and
    patterning the conductive layer to form the patterned conductive layer.

17. The manufacturing process for a QFN chip package structure as claimed in claim 15, wherein a method for providing the patterned conductive layer and the patterned solder resist layer comprises:
    providing a solder resist layer;
    forming a conductive layer on the solder resist layer;
    patterning the solder resist layer to form the patterned solder resist layer, wherein a part of the conductive layer is exposed by the patterned solder resist layer; and
    patterning the conductive layer to form the patterned conductive layer.

18. The manufacturing process for a QFN chip package structure as claimed in claim 15, wherein a method for providing the patterned conductive layer and the patterned solder resist layer comprises:
    providing a conductive layer;
    forming a solder resist layer on the conductive layer;
    patterning the conductive layer to form the patterned conductive layer; and
    patterning the solder resist layer to form the patterned solder resist layer, wherein a part of the patterned conductive layer is exposed by the patterned solder resist layer.

19. The manufacturing process for a QFN chip package structure as claimed in claim 15, wherein a method for providing the patterned conductive layer and the patterned solder resist layer comprises:
    providing a solder resist layer;
    forming a conductive layer on the solder resist layer;
    patterning the conductive layer to form the patterned conductive layer; and
    patterning the solder resist layer to form the patterned solder resist layer, wherein a part of the patterned conductive layer is exposed by the patterned solder resist layer.

20. The manufacturing process for a QFN chip package structure as claimed in claim 15, wherein a plurality of die pads and a plurality of leads are formed on the patterned conductive layer.

21. The manufacturing process for a QFN chip package structure as claimed in claim 15, wherein a plurality of first openings and a plurality of second openings are formed on the patterned solder resist layer, wherein a part of the patterned conductive layer is exposed by the first openings and the second openings.

22. The manufacturing process for a QFN chip package structure as claimed in claim 15, further comprising forming an adhesive layer between the chips and the patterned conductive layer.

23. The manufacturing process for a QFN chip package structure as claimed in claim 15, wherein a brown oxidation or a black oxidation process can further be performed on the patterned conductive layer.

* * * * *